United States Patent
Lee et al.

(10) Patent No.: US 9,634,283 B2
(45) Date of Patent: Apr. 25, 2017

(54) LOW TEMPERATURE VISCOSITY TRANSITION COMPOSITION, DISPLAY APPARATUS INCLUDING THE SAME, AND METHOD OF MANUFACTURING THE SAME

(71) Applicant: SAMSUNG DISPLAY CO., LTD., Yongin, Gyeonggi-Do (KR)

(72) Inventors: Ilsang Lee, Yongin (KR); Sunyoung Jung, Yongin (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 1 day.

(21) Appl. No.: 14/627,320

(22) Filed: Feb. 20, 2015

(65) Prior Publication Data

US 2016/0093826 A1 Mar. 31, 2016

(30) Foreign Application Priority Data

Sep. 25, 2014 (KR) .......................... 10-2014-0128285

(51) Int. Cl.
| | | |
|---|---|---|
| H01L 51/52 | (2006.01) | |
| H01L 51/56 | (2006.01) | |
| C03C 8/02 | (2006.01) | |
| C03C 3/247 | (2006.01) | |
| C03C 8/08 | (2006.01) | |

(52) U.S. Cl.
CPC .......... *H01L 51/5243* (2013.01); *C03C 3/247* (2013.01); *C03C 8/02* (2013.01); *C03C 8/08* (2013.01); *H01L 51/56* (2013.01); *H01L 51/5253* (2013.01); *H01L 2251/303* (2013.01)

(58) Field of Classification Search
CPC . H01L 51/5243; H01L 51/56; H01L 51/5253; H01L 2251/303; C03C 8/02
See application file for complete search history.

(56) References Cited

U.S. PATENT DOCUMENTS

| | | | |
|---|---|---|---|
| 6,306,783 B1 | 10/2001 | Yamanaka | |
| 2006/0128549 A1* | 6/2006 | Hormadaly | C03C 3/16 501/45 |
| 2007/0040501 A1 | 2/2007 | Aitken et al. | |
| 2009/0121333 A1* | 5/2009 | Aitken | C23C 14/10 257/678 |
| 2013/0240351 A1 | 9/2013 | Aitken et al. | |
| 2014/0228197 A1* | 8/2014 | Oogaki | C03C 3/16 501/46 |

FOREIGN PATENT DOCUMENTS

| | | |
|---|---|---|
| KR | 10-2008-0045217 A | 5/2008 |
| WO | WO 2014/066455 A2 | 5/2014 |

OTHER PUBLICATIONS

"Preparation and properties od SnO—$SnCl_2$—$P_2O_5$ glass," Morinaga, et al. Journal of Non-Crystalline Solids vol. 282(1) pp. 118-124 (2001).

"Structure of $SnF_2$—SnO—$P_2O_5$ Glasses," York-Winegar, et al. Physics Procedia vol. 44 pp. 159-165 (2013).

* cited by examiner

*Primary Examiner* — John P Dulka
*Assistant Examiner* — Charles R Peters
(74) *Attorney, Agent, or Firm* — Lee & Morse, P.C.

(57) ABSTRACT

A low-temperature viscosity transition (LVT) composition, including a tantalum oxide, a display apparatus including the same, and a method of manufacturing the same.

10 Claims, 2 Drawing Sheets

LOW TEMPERATURE VISCOSITY TRANSITION COMPOSITION, DISPLAY APPARATUS INCLUDING THE SAME, AND METHOD OF MANUFACTURING THE SAME

CROSS-REFERENCE TO RELATED APPLICATION

Korean Patent Application No. 10-2014-0128285, filed on Sep. 25, 2014, in the Korean Intellectual Property Office, and entitled: "Low Temperature Viscosity Transition Composition, Display Apparatus Including the Same, and Method of Manufacturing the Same," is incorporated by reference herein in its entirety.

BACKGROUND

1. Field

One or more exemplary embodiments relate to a low-temperature viscosity transition (LVT) composition, a display apparatus including the same, and a method of manufacturing the same.

2. Description of the Related Art

Organic light emitting devices are self-emission devices that may have wide viewing angles, high contrast ratios, short response times, and excellent brightness, driving voltage, and response speed characteristics, and may produce full-color images.

SUMMARY

Embodiments may be realized by providing a low temperature viscosity transition (LVT) composition, including a tantalum oxide.

A viscosity transition temperature of the LVT composition may be from about 80° C. to about 200° C.

An amount of the tantalum oxide may be from about 0.1 mol % to about 2.5 mol % with respect to a total molar percentage of the LVT composition.

The LVT composition may further include one or more of a tin oxide, a phosphorus oxide, a tin fluoride, a boron oxide, a boron phosphate, a vanadium oxide, a niobium oxide, a tungsten oxide, or a cerium oxide.

The LVT composition may further include a phosphorus oxide and a boron oxide.

The LVT composition may further include a tin oxide, a phosphorus oxide, and a boron oxide.

The LVT composition may further include a tin oxide, a phosphorus oxide, a tin fluoride, and a boron oxide.

The LVT composition may include from about 0.1 mol % to about 2.5 mol % of $Ta_2O_5$; from about 5 mol % to about 20 mol % of SnO; from about 10 mol % to about 40 mol % of $P_2O_5$; from about 35 mol % to about 70 mol % of $SnF_2$; and from about 1 mol % to about 5 mol % of $B_2O_3$.

Embodiments may be realized by providing a display apparatus, including a substrate; an organic light-emitting device on the substrate, and an encapsulating layer on the organic light-emitting device, the encapsulating layer including a low temperature viscosity transition (LVT) inorganic substance including tantalum (Ta) as a constituent element, the organic light-emitting device including a first electrode, a second electrode, and an organic layer between the first electrode and the second electrode.

The LVT inorganic substance may be formed from an LVT composition including a tantalum oxide.

The LVT inorganic substance may further include one or more of tin (Sn), phosphorus (P), fluorine (F), boron (B), vanadium (V), niobium (Nb), tungsten (W), or oxygen (O).

The LVT inorganic substance may further include P, B, and O as constituent elements.

The LVT inorganic substance may further include Sn, P, B, and O as constituent elements.

The LVT inorganic substance may further include Sn, P, B, F, and O as constituent elements.

The LVT inorganic substance may include from about 0.15 mol % to about 0.7 mol % of Ta; from about 8.0 mol % to about 23 mol % of Sn; from about 7.0 mol % to about 21 mol % of P; from about 0.4 mol % to about 2.5 mol % of B; from about 15 mol % to about 37 mol % of F; and from about 30 mol % to about 50 mol % of O as constituent elements.

The encapsulating layer may have a water resistance of from about $100 \times 10^{-6}$ g to about $400 \times 10^{-6}$ g, as determined by a change in mass of a specimen of the encapsulating layer having a size of 10 mm×5 mm×5 mm after being kept for 12 hours in a thermostatic bath containing water at 100° C.

Embodiments may be realized by providing a method of manufacturing a display apparatus, the method including providing an organic light-emitting device on a substrate, the organic light-emitting device including a first electrode, a second electrode, and an organic layer between the first electrode and the second electrode; and providing an encapsulating layer on the organic light-emitting device, the encapsulating layer including a low temperature viscosity transition (LVT) inorganic substance including tantalum (Ta) as a constituent element.

The LVT inorganic substance may be formed from an LVT composition including a tantalum oxide.

Providing an encapsulating layer may include evaporating an LVT composition on the organic light-emitting device to provide a preliminary encapsulating layer; and repairing the preliminary encapsulating layer.

The organic layer may include an organic substance; and repairing the preliminary encapsulating layer may be performed at a temperature equal to or higher than a viscosity transition temperature of the LVT composition and lower than a denaturation temperature of the organic substance.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
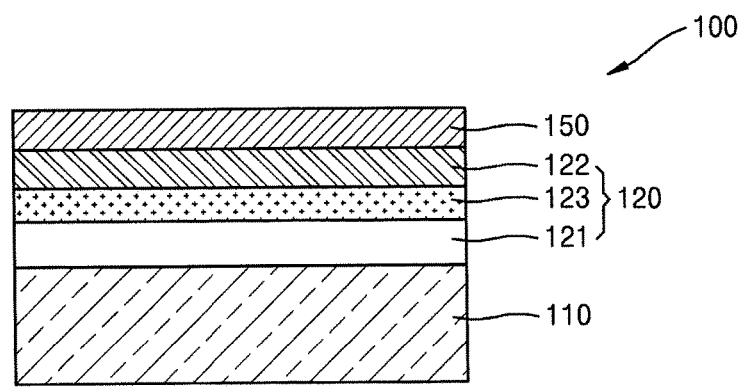
FIG. 1 illustrates a schematic cross-sectional diagram of a display apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In following exemplary embodiments, terms like first and second are used for the purpose of differentiating one component from the other, not to limit the meaning.

In following exemplary embodiments, an expression used in the singular encompasses the expression of the plural, unless it has a clearly different meaning in the context.

In following exemplary embodiments, terms such as "including" or "having," etc., are intended to indicate the existence of the features or components disclosed in the specification, and are not intended to preclude the possibility that one or more other features or components may be added.

In following exemplary embodiments, when a part such as a layer, a region, or an component is referred to as being "on" another part, it can be directly on another part, or intervening components such as another layer, region, or component may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

In drawings, the sizes of components may be exaggerated for convenience of explanation. For example, the size and thickness of each configuration illustrated in the drawings are arbitrarily illustrated for the sake of convenience of explanation, and thus the present disclosure may not be necessarily limited to the illustration.

In following exemplary embodiments, x-axis, y-axis, and z-axis are not limited to three axes on an orthogonal coordinate system, but may be widely interpreted as to include the three axes on an orthogonal coordinate system. For example, x-axis, y-axis, and z-axis may be orthogonal to each other, but may refer to another direction that is not orthogonal.

When an exemplary embodiment may be realized differently, a particular procedure may be performed differently from a procedure described herein. For example, two processes that are described consecutively may be performed at the same time substantially, or may be performed in an order that is opposite to an order described herein.

Hereinafter, exemplary embodiments will be described in detail with reference to the accompanying drawings. In describing exemplary embodiments with reference to the accompanying drawings, like elements are referenced by like reference numerals, and description thereof is not repeated.

An LVT composition according to an exemplary embodiment may include a tantalum oxide. The LVT composition may be used to form an LVT inorganic substance including tantalum (Ta).

For example, tantalum may serve as a network modifier in the LVT inorganic substance. In the LVT inorganic substance, one tantalum atom may be bound to five of the same or different constituent atoms of the LVT inorganic substance. In the LVT inorganic substance including tantalum, tantalum atom may be placed in an empty space of a main backbone of the LVT inorganic substance including a phosphorus (P)-oxygen (O)-phosphorus (P) bond or a phosphorus (P)-oxygen (O)-boron (B) bond, and steric hindrance may be incurred. The probability for a P—O—P bond or P—O—B bond to contact with $H_2O$ may become lower due to the steric hindrance, and tantalum may decrease a degradation reaction of the LVT inorganic substance shown in Mechanism 1 below. Therefore, the LVT composition may include a tantalum oxide, and a water resistance of the LVT inorganic substance may be improved.

Mechanism 1

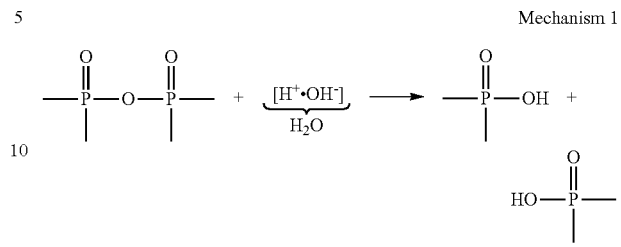

The term "viscosity transition temperature" used herein refers not only to a temperature at which the LVT composition completely changes from a solid state to a liquid state but also a lowest temperature at which the LVT composition may become fluid, which is the lowest temperature at which the viscosity of the LVT composition is changed. The "viscosity transition temperature" of the LVT composition is described later.

For example, a viscosity transition temperature of the LVT composition may be from about 80° C. to about 200° C. As another example, a viscosity transition temperature of the LVT composition may be equal to or higher than 90° C., equal to or higher than 100° C., or equal to or lower than 190° C. As another example, a viscosity transition temperature of the LVT composition may be from about 180° C. to about 190° C.

For example, the tantalum oxide may be $Ta_2O_5$. In another example, the tantalum oxide may be $Ta_2O_3$.

For example, the LVT composition may include a tantalum oxide in a range from about 0.1 mol % to about 2.5 mol % with respect to the total molar percentage of the LVT composition. In another example, the LVT composition may include a tantalum oxide in a range from about 0.5 mol % to about 1.0 mol % with respect to the total molar percentage of the LVT composition. Maintaining the amount of a tantalum oxide within the range may help provide an LVT composition having high transparency and high water resistance.

For example, the LVT composition may further include one or more of a tin oxide (for example, SnO or $SnO_2$), a phosphorus oxide (for example, $P_2O_5$), a tin fluoride (for example, $SnF_2$), a boron oxide (for example, $B_2O_3$), boron phosphate ($BPO_4$), a vanadium oxide (for example, $V_2O_5$), a niobium oxide (for example, $Nb_2O_5$), a tungsten oxide (for example, $WO_3$), or a cerium oxide (for example, $Ce_2O$).

In another example, the LVT composition may further include one or more of SnO, $P_2O_5$, $SnF_2$, $B_2O_3$, $BPO_4$, $V_2O_5$, $Nb_2O_5$, $WO_3$, or $CeO_2$.

For example, the LVT composition may further include a tin oxide. The LVT composition may include a tin oxide in a range, for example, from about 5 mol % to about 20 mol %. Maintaining the amount of tin oxide within the range may help provide the LVT composition with low melting point glass properties.

For example, the LVT composition may further include a phosphorus oxide. The LVT composition may include a phosphorus oxide in a range, for example, from about 10 mol % to about 40 mol %. Maintaining the amount of the phosphorous oxide within this range may help provide the LVT composition with high water resistance glass properties.

For example, the LVT composition may further include a tin fluoride. The LVT composition may include a tin fluoride in a range, for example, from about 35 mol % to about 70 mol %. Maintaining the amount of the tin fluoride within the range may help provide the LVT composition with low melting point glass properties.

For example, the LVT composition may further include a boron oxide. The LVT composition may include the boron oxide in a range, for example, from about 1 mol % to about 5 mol %. Maintaining the amount of the boron oxide within this range may help provide the LVT composition with high water resistance and high transparency glass properties.

For example, the LVT composition may further include a phosphorus oxide and a boron oxide. A main backbone of an LVT inorganic substance formed from the LVT composition may be derived from P, B, and O of the phosphorus oxide and boron oxide included in the LVT composition, the LVT inorganic substance may include a P—O—B bond, and the LVT inorganic substance may have improved water resistance.

For example, the LVT composition may further include a tin oxide, a phosphorus oxide, and a boron oxide. A main backbone of the LVT inorganic substance formed from the LVT composition may be derived from Sn, P, B, and O of the tin oxide, phosphorus oxide, and boron oxide included in the LVT composition, the LVT inorganic substance may include a P—O—P bond, a P—O—B bond, an Sn—O—P bond and/or an Sn—O—Sn bond, and the LVT inorganic substance may have improved water resistance.

For example, the LVT composition may further include a tin oxide, a phosphorus oxide, a tin fluoride, and a boron oxide. The LVT composition may include a tin fluoride, and a reduced melting point may be provided. For example, since fluoride (F) is an element having large electronegativity, F may weaken bonding between molecules in the LVT composition.

For example, the LVT composition may include from about 0.1 mol % to about 2.5 mol % of a tantalum oxide; from about 10 mol % to about 60 mol % of a tin oxide; from about 10 mol % to about 35 mol % of a phosphorous oxide; from about 10 mol % to about 40 mol % of a tin fluoride; and from about 0.5 mol % to about 5 mol % of a boron oxide. The mol % sum of the tantalum oxide, tin oxide, phosphorous oxide, tin fluoride, and boron oxide may be 100 mol %. The LVT composition having the amounts described above may have high water resistance and low viscosity transition temperature.

In another example, the LVT composition may include from about 0.1 mol % to about 2.5 mol % of $Ta_2O_5$; from about 10 mol % to about 60 mol % of SnO; from about 10 mol % to about 35 mol % of $P_2O_5$; from about 10 mol % to about 40 mol % of $SnF_2$; and from about 0.5 mol % to about 5 mol % of $B_2O_3$. The mol % sum of $Ta_2O_5$, SnO, $P_2O_5$, $SnF_2$ and $B_2O_3$ may be 100 mol %. The LVT composition having the amounts described above may have high water resistance and low viscosity transition temperature.

In another example, the LVT composition may include 8.9 mol % of $Ta_2O_5$; 29.6 mol % of SnO; 57.8 mol % of $P_2O_5$; 3 mol % of $SnF_2$; and 0.75 mol % of $B_2O_3$. The LVT composition having the amounts described above may have high water resistance and low viscosity transition temperature.

FIG. 1 illustrates a schematic cross-sectional diagram of a display apparatus according to an exemplary embodiment.

A display apparatus 100 may include a substrate, a display device, and an encapsulating layer 150 including an LVT inorganic substance that includes tantalum.

The substrate 110 may be formed from various materials. For example, the substrate 110 may be formed from a transparent glass substrate containing $SiO_2$ as a main component. The substrate 110 may be formed from a flexible material, for example, a plastic material.

The display device 120 may have various forms. The display device 120 may be, for example, an organic light-emitting device (OLED) or a liquid crystal device (LCD). In an exemplary embodiment, the display device 120 may be any display device that may realize visible light at a user side.

FIG. 1 illustrates a case where the display device 120 may be an OLED. The display device 120 may include a first electrode 121, a second electrode 122, and an organic layer 123 interposed between the first electrode 121 and the second electrode 122.

Although not illustrated, a buffer layer (not shown) may further be formed between the first electrode 121 and a substrate 110. A buffer layer (not shown) may provide a plane surface on the substrate 110 and prevent water or gas from penetrating through the substrate 110.

A single or a plurality of barrier layers formed from a material the same as or similar to a material of the buffer layer (not shown) may be formed between the substrate 110 and the buffer layer (not shown). For example, the substrate 110 may be formed from a plastic material, and a barrier layer (not shown) may be arranged on the substrate 110 to sufficiently prevent penetration of moisture therethrough.

The first electrode 121 may function as an anode and the second electrode 122 may function as a cathode, or vice versa. When the first electrode 121 functions as an anode, the first electrode 121 may include a material having a high work function such as ITO, IZO, ZnO, or $In_2O_3$. According to objectives and design conditions, the first electrode 121 may further include a reflective layer formed from Ag, Mg, Al, Pt, Pd, Au, Ni, Nd, Ir, Cr, Li, Yb, or Ca. When the second electrode 122 functions as a cathode, the second electrode 122 may be formed from a metal such as Ag, Mg, Al, Pt, Pd, Au, Ni, Nd, Ir, Cr, Li, or Ca. The second electrode 122 may include ITO, IZO, ZnO, or $In_2O_3$ to allow light penetration.

The organic layer 123 may include an emission layer. The organic layer 123 may include an emission layer, and selectively include one or more of a hole transport region that is interposed between a first electrode 121 and the emission layer; or an electron transport region that is interposed between the emission layer and the second electrode 122.

When an electric voltage is applied to the first electrode 121 and the second electrode 122, visible light may be emitted from the organic layer 123, for example, from the emission layer of the organic layer 123.

Although not illustrated, the display apparatus 100 of the present exemplary embodiment may include at least one thin film transistor (not shown) that is electrically connected to the display device 120.

The display apparatus 100 may include at least one capacitor that is electrically connected to a display device 120.

Although not illustrated, at least one capping layer (not shown) may be formed between the display device 120 and an encapsulating layer 150. The capping layer (not shown) may protect the display device 120, for example, the second electrode 122 that is a top layer of the display device 120. In a selective exemplary embodiment, the capping layer (not shown) may be formed to control a refractive index to improve a luminance efficiency when light emitted from the display device 120 is extracted in a direction toward the second electrode 122. In a selective exemplary embodiment, the refractive index of the capping layer (not shown) may be greater than that of a layer thereunder, for example, the second electrode 122.

In another selective exemplary embodiment, a planarization layer (not shown) or a protective layer (not shown) may be formed between a display device 120 and an encapsulating layer 150. The planarization layer or protective layer may provide a plain surface on the display device 120, and the display device 120 may be primarily protected. The planarization layer or protective layer may be formed from various insulating materials. For example, the planarization layer or protective layer may be formed from an organic material.

An encapsulating layer 150 may be formed on the display device 120. The encapsulating layer 150 may include an LVT inorganic substance including tantalum. A method of forming the encapsulating layer 150 will be described hereinafter.

First, an LVT composition including tantalum may be provided on the display device 120 to form the planarization layer or protective layer on the display device 120.

An exemplary method of forming the planarization layer or protective layer is by evaporating the LVT composition. When the LVT composition is evaporated, a preliminary encapsulating layer for forming the encapsulating layer 150 may be formed.

The preliminary encapsulating layer formed by evaporation may include various defects, for example, a film-forming element, a pinhole, and an environmental element. The environmental element may be in the form of a particle of an organic substance or an inorganic substance that is attached to the preliminary encapsulating layer during a process among a plurality of processes for forming an OLED. A defect such as a vacant space may also be formed between the preliminary encapsulating layer and the display device 120. The film-forming element refers to an LVT composition coagulation particle that does not contribute to film-forming when the preliminary encapsulating layer is formed. The pinhole refers to a region where the LVT composition is not provided.

The defects of the preliminary encapsulating layer may cause the occurrence of a migration channel for external environmental materials, for example, water or oxygen, and progressive dark spots may be formed on the preliminary encapsulating layer, which may cause a decrease of the lifespan of the display device 120.

The viscosity transition temperature of the LVT composition may be lower than a denaturation temperature of a material included in the display device 120, for example, a material included in the organic layer 123. For example, the viscosity transition temperature of the LVT composition may be lower than the minimum of the denaturation temperature of the materials included in the organic layer 123. A denaturation temperature of the organic layer 123 refers to a temperature at which physical denaturation and/or chemical denaturation of a material included in the organic layer 123 may be caused. According to the type and number of the materials included in the organic layer 123, the organic layer may be characterized by a plurality of denaturation temperatures.

For example, the viscosity transition temperature of the LVT composition may be a softening point ($T_f$) of the LVT composition, and the denaturation temperature of the organic layer 123 may refer to a glass transition temperature ($T_g$) of an organic substance included in the organic layer 123.

The softening point may be measured by performing a thermo gravimetric analysis (TGA) of the LVT composition. In a selective exemplary embodiment, the softening point may be derived from the results of performing a thermal analysis of the LVT composition by using TGA and differential scanning calorimetry (DSC) ($N_2$ atmosphere, temperature range: from room temperature to 600° C. (10° C./min)-TGA, from room temperature to 400° C.-DSC, Pan Type: Pt Pan in disposable Al Pan (TGA), disposable Al pan (DSC)). At the softening point, an apparent flow of a material occurs. The softening point may also be derived by measuring a viscosity change, heat absorption, or heat emission.

The glass transition temperature may be measured by performing TGA of an organic substance included in the organic layer 123. In a selective exemplary embodiment, the glass transition temperature may be derived from the results of performing a thermal analysis of an organic substance included in the organic layer 123 by using TGA and differential scanning calorimetry (DSC) ($N_2$ atmosphere, temperature range: from room temperature to 600° C. (10° C./min)-TGA, from room temperature to 400° C.-DSC, Pan Type: Pt Pan in disposable Al Pan (TGA), disposable Al pan (DSC)). At the glass transition temperature, an apparent flow of a material does not occur. The glass transition temperature may also be derived by measuring a viscosity change, heat absorption, or heat emission.

The denaturation temperature of a material included in the organic layer 123 may exceed, for example, 200° C. The denaturation temperature of the material included in the organic layer 123 may be measured by performing a TGA analysis of a material included in the organic layer 123, as described above.

A minimum of the denaturation temperatures of the materials included in the organic layer 123 may be, for example, from about 200° C. to about 210° C. For example, a minimum of the denaturation temperatures of the materials included in the organic layer 123 may be 212° C. A minimum of the denaturation temperatures of the materials included in the organic layer 123 may be determined by obtaining $T_g$ values by performing the TGA of the materials included in the organic layer 123, as described above, and then selecting a minimum among the various $T_g$ values.

For example, a viscosity transition temperature of the LVT composition may be in a range from about 80° C. to about 200° C. In another example, a viscosity transition temperature of the LVT composition may be equal to or higher than 90° C., equal to or higher than 100° C., or equal to or lower than 190° C. In another example, a viscosity transition temperature of the LVT composition may be in a range from about 180° C. to about 190° C.

For example, the LVT inorganic substance may further include one or more of tin (Sn), phosphorus (P), fluorine (F), boron (B), vanadium (V), niobium (Nb), tungsten (W), or oxygen (O), the LVT inorganic substance may include a P—O—B bond, and the LVT inorganic substance may have improved water resistance.

For example, the LVT inorganic substance may further include Sn, P, B, and O, the LVT inorganic substance may include an Sn—O—P bond and a P—O—B bond, and the LVT inorganic substance may have improved water resistance.

For example, the LVT inorganic substance may further include Sn, P, B, F, and O. The LVT inorganic substance may include F, and the melting point of the LVT inorganic substance may decrease.

For example, the LVT inorganic substance may further include Ta from about 0.15 mol % to about 0.5 mol %; from about 8.0 mol % to about 23 mol % of Sn; from about 7.0 mol % to about 20 mol % of P; from about 0.4 mol % to about 2.4 mol % of B; from about 17 mol % to about 37 mol % of F; and from about 30 mol % to about 50 mol % of O.

For example, the encapsulating layer may have water resistance of a range from about $100\times10^{-6}$ g to about $400\times10^{-6}$ g.

An encapsulating layer having such a composition may be formed, and the encapsulating layer may not affect the organic layer 123. As a selective example, various types of defects, e.g., of the preliminary encapsulating layer, generated during the process of forming the encapsulating layer 150 may be repaired.

Figure 2:
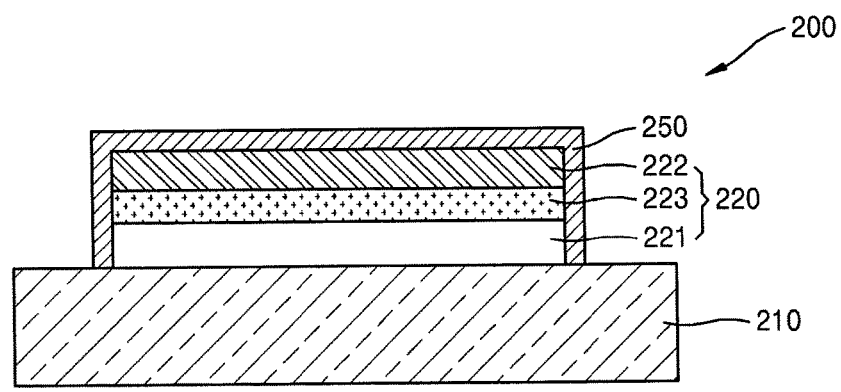
FIG. 2 illustrates a schematic cross-sectional diagram of a display apparatus according to another exemplary embodiment.

FIG. 2 illustrates a schematic cross-sectional diagram of a display apparatus according to another exemplary embodiment. As shown in FIG. 2, the display apparatus 200 may include a substrate 210, a display device 220, and an encapsulating layer 250. A display device 220 may include a first electrode 221, a second electrode 222, and an organic layer 223.

For convenience of explanation, the explanation of the present exemplary embodiment is focused on the differences with the exemplary embodiment described above.

In comparison with the exemplary embodiment described above, the encapsulating layer 250 of the exemplary embodiment of FIG. 2 has a different structure. The encapsulating layer 250 may cover the top surface and the lateral surface of a displayer device 220, and the encapsulating layer 250 may prevent the display device 220 from being damaged by moisture, external gases, and foreign matters. The encapsulating layer 250 may be in contact with a substrate 210, and the encapsulating layer 250 may effectively seal a display device 220. The encapsulating layer 250 may be in contact with the substrate 210, the OLED 200 may be prevented from being peeled off, and durability of the encapsulating layer 250 may be improved. Although not illustrated, the encapsulating layer 250 may be in contact with an insulating film or a conductive film formed on the top surface of a substrate 210.

The materials used to form the display device 220 and the encapsulating layer 250 may be the same as the exemplary embodiment described above, and an explanation of the materials is omitted.

Figure 3:
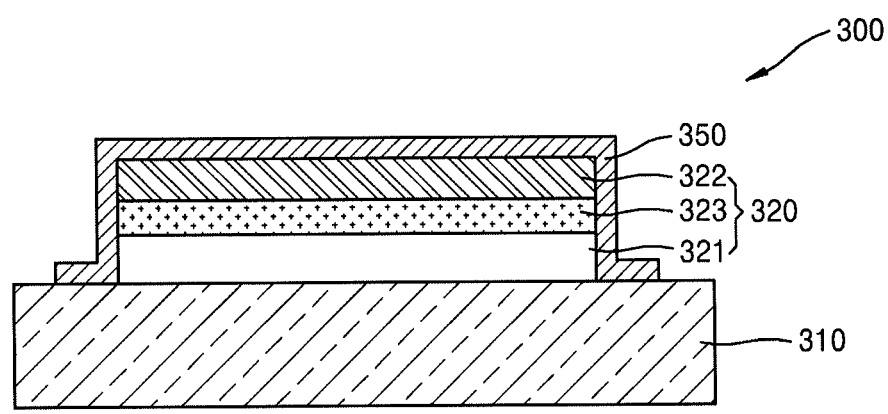
FIG. 3 illustrates a schematic cross-sectional diagram of a display apparatus according to another exemplary embodiment.

FIG. 3 illustrates a schematic cross-sectional diagram of a display apparatus according to another exemplary embodiment. As shown in FIG. 3, the display apparatus 330 may include a substrate 310, a display device 320, and an encapsulating layer 350. The display device 320 may include a first electrode 321, a second electrode 322, and an organic layer 323.

For convenience of explanation, the explanation of the present exemplary embodiment is focused on the differences with the exemplary embodiments described above.

Edges of an encapsulating layer 350 may be formed to protrude. For example, among the regions of the encapsulating layer 350, a region that may be in contact with the substrate 310 may be formed to protrude, and the contacting area between the encapsulating layer 350 and the substrate 310 may be increased. As the contacting area between the encapsulating layer 350 and the substrate 310 is increased, penetration of moisture, gases, and foreign matters through the gap between the encapsulating layer 350 and the substrate 310 may be effectively prevented, the encapsulating layer 350 may be stably bound to the substrate 310, and the durability of the encapsulating layer 350 and the OLED 300 may be improved.

The materials used to form the display device 320 and the encapsulating layer 350 may be the same as the exemplary embodiment described above, and an explanation of the materials is omitted.

The following Example and Comparative Example are provided in order to highlight characteristics of one or more embodiments, but it will be understood that the Example and Comparative Example are not to be construed as limiting the scope of the embodiments, nor is the Comparative Example to be construed as being outside the scope of the embodiments. Further, it will be understood that the embodiments are not limited to the particular details described in the Example and Comparative Example.

Example 1

The compounds shown in Table 1 were mixed at the indicated amounts described to prepare an LVT composition.

TABLE 1

| | Example 1 | | | | |
|---|---|---|---|---|---|
| Compound | SnO | $P_2O_5$ | $SnF_2$ | $B_2O_3$ | $Ta_2O_5$ |
| Amount (mol %) | 8.9 | 29.6 | 57.8 | 3 | 0.7 |

Temperatures $T_g$ and $T_f$ of the LVT composition were measured by performing DSC (TG8120, Rigaku, Japan) and the results are shown in Table 2.

TABLE 2

| | $T_g$ (° C.) | $T_f$ (° C.) |
|---|---|---|
| Example 1 | 170 | 187.9 |

A target jig that may be mounted on a sputter was formed by using the LVT composition, and then an inorganic film including an LVT inorganic substrate sputtering was formed by sputtering by using the target jig. The power source used for the sputtering was an RF Power Supply Source (Enterpulse 5, EN technology).

The inorganic film was divided into specimens having a size of 10 mm×5 mm×5 mm. After measuring the mass of each specimen, the specimens were kept for 12 hours in a thermostatic bath containing water at 100° C. Then, the mass of each specimen was measured. The change of the mass of the specimen before and after the thermostatic bath procedure was $335.2\times10^{-6}$ g.

Comparative Example 1

The compounds shown in Table 3 were mixed at the indicated amounts to prepare an LVT composition.

TABLE 3

| | Comparative Example 1 | | | | |
|---|---|---|---|---|---|
| Compound | SnO | $P_2O_5$ | $SnF_2$ | $B_2O_3$ | $Nb_2O_5$ |
| Amount (mol %) | 40.93 | 30.03 | 26.92 | 1.49 | 0.63 |

Temperatures $T_g$ and $T_f$ of the LVT composition were measured by performing DSC (TG8120, Rigaku, Japan) and the results are shown in Table 4.

TABLE 4

|  | $T_g$ (° C.) | $T_f$ (° C.) |
| --- | --- | --- |
| Comparative Example 1 | 187 | 198 |

A target jig that may be mounted on a sputter was formed by using the LVT composition, and then an inorganic film including an LVT inorganic substrate sputtering was formed by sputtering by using the target jig. The power source used for the sputtering was an RF Power Supply Source (Enterpulse 5, EN technology).

The inorganic film was divided into specimens having a size of 10 mm×5 mm×5 mm. After measuring the mass of each specimen, the specimens were kept for 12 hours in a thermostatic bath containing water at 100° C. Then, the mass of each specimen was measured. The change of the mass of the specimen before and after the thermostatic bath procedure was $298 \times 10^{-6}$ g.

The LVT composition of Example 1 had a lower viscosity transition temperature than the LVT composition of Comparative Example 1, and the LVT composition of Example 1 may be used to form an LVT inorganic substance having better water resistance than the LVT composition of Comparative Example 1.

By way of summation and review, an organic light-emitting device may include a first electrode that is disposed on a substrate, and a hole transport region, an emission layer, an electron transport region, and a second electrode, which are sequentially disposed on the first electrode. Holes provided from the first electrode may pass through the hole transport region toward the emission layer, and electrons provided from the second electrode may pass through the electron transport region toward the emission layer. Carriers, such as the holes and electrons, may be recombined in the emission layer, excitons that change from an excited state to a ground state may be provided, and light may be generated.

The organic light-emitting devices may be deteriorated by oxygen and/or moisture, and the organic light-emitting devices may further include an encapsulating unit.

As described above, according to the one or more of the above exemplary embodiments, a display apparatus according may have an improved encapsulating characteristic.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A low temperature viscosity transition (LVT) composition, comprising:
    from about 0.1 mol % to about 2.5 mol % of $Ta_2O_5$;
    from about 5 mol % to about 20 mol % of SnO;
    from about 10 mol % to about 40 mol % of $P_2O_5$;
    from about 35 mol % to about 70 mol % of $SnF_2$; and
    from about 1 mol % to about 5 mol % of $B_2O_3$,
    wherein a viscosity transition temperature of the LVT composition is from about 80° C. to about 200° C.

2. The LVT composition as claimed in claim 1, further comprising one or more of a boron phosphate, a vanadium oxide, a niobium oxide, a tungsten oxide, or a cerium oxide.

3. A display apparatus, comprising:
    a substrate;
    an organic light-emitting device on the substrate, and
    an encapsulating layer on the organic light-emitting device, the encapsulating layer including a low temperature viscosity transition (LVT) inorganic substance, wherein the LVT inorganic substance is prepared from a LVT composition, a viscosity transition temperature of the LVT composition being from about 80° C. to about 200° C.,
    the organic light-emitting device including a first electrode, a second electrode, and an organic layer between the first electrode and the second electrode,
    wherein the LVT inorganic substance includes:
        from about 0.15 mol % to about 0.7 mol % of Ta;
        from about 8.0 mol % to about 23 mol % of Sn;
        from about 7.0 mol % to about 21 mol % of P;
        from about 0.4 mol % to about 2.5 mol % of B;
        from about 15 mol % to about 37 mol % of F; and
        from about 30 mol % to about 50 mol % of O as constituent elements.

4. The display apparatus as claimed in claim 3, wherein the LVT composition includes a tantalum oxide.

5. The display apparatus as claimed in claim 3, wherein the LVT inorganic substance further includes one or more of vanadium (V), niobium (Nb), or tungsten (W).

6. The display apparatus as claimed in claim 3, wherein the encapsulating layer has a water resistance of from about $100 \times 10^{-6}$ g to about $400 \times 10^{-6}$ g, as determined by a change in mass of a specimen of the encapsulating layer having a size of 10 mm×5 mm×5 mm after being kept for 12 hours in a thermostatic bath containing water at 100° C.

7. A method of manufacturing a display apparatus, the method comprising:
    providing an organic light-emitting device on a substrate, the organic light-emitting device including a first electrode, a second electrode, and an organic layer between the first electrode and the second electrode; and
    providing an encapsulating layer on the organic light-emitting device, the encapsulating layer including a low temperature viscosity transition (LVT) inorganic substance,
    wherein the LVT inorganic substance is prepared from a LVT composition, a viscosity transition temperature of the LVT composition being from about 80° C. to about 200° C., and
    wherein the LVT inorganic substance includes:
        from about 0.15 mol % to about 0.7 mol % of Ta;
        from about 8.0 mol % to about 23 mol % of Sn;
        from about 7.0 mol % to about 21 mol % of P;
        from about 0.4 mol % to about 2.5 mol % of B;
        from about 15 mol % to about 37 mol % of F; and
        from about 30 mol % to about 50 mol % of O as constituent elements.

8. The method as claimed in claim 7, wherein the LVT composition includes a tantalum oxide.

9. The method as claimed in claim 7, wherein providing an encapsulating layer includes:

evaporating the LVT composition on the organic light-emitting device to provide a preliminary encapsulating layer; and repairing the preliminary encapsulating layer.

10. The method as claimed in claim 9, wherein:

the organic layer includes an organic substance; and repairing the preliminary encapsulating layer is performed at a temperature equal to or higher than the viscosity transition temperature of the LVT composition and lower than a denaturation temperature of the organic substance.

* * * * *